(12) United States Patent
Rasmus et al.

(10) Patent No.: US 11,095,273 B1
(45) Date of Patent: Aug. 17, 2021

(54) HIGH-SPEED SENSE AMPLIFIER WITH A DYNAMICALLY CROSS-COUPLED REGENERATION STAGE

(71) Applicant: QUALCOMM Incorporated, San Diego, CA (US)

(72) Inventors: Todd Morgan Rasmus, Cary, NC (US); Li Sun, Irvine, CA (US); Dong Ren, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/940,280

(22) Filed: Jul. 27, 2020

(51) Int. Cl.
| | |
|---|---|
| *H03K 3/037* | (2006.01) |
| *H04L 25/03* | (2006.01) |
| *G11C 7/06* | (2006.01) |
| *H03K 5/24* | (2006.01) |
| *H03M 9/00* | (2006.01) |

(52) U.S. Cl.
CPC ............... *H03K 3/037* (2013.01); *G11C 7/06* (2013.01); *G11C 7/065* (2013.01); *H03K 5/24* (2013.01); *H03K 5/2472* (2013.01); *H04L 25/03* (2013.01); *H03M 9/00* (2013.01)

(58) Field of Classification Search
CPC ........ H03K 3/027; H03K 3/037; H03K 3/353; H03K 3/356; H03K 3/356069; H03K 3/356104; H03K 3/356113; H03K 3/35613; H03K 3/356165; H03K 5/24; H03K 5/2472; H03K 5/2481; H03K 5/249; G11C 7/06; G11C 7/065; G11C 7/067
See application file for complete search history.

(56) References Cited

U.S. PATENT DOCUMENTS

| | | | |
|---|---|---|---|
| 8,188,768 B2* | 5/2012 | Bae | H03K 3/356139 327/66 |
| 2010/0283511 A1* | 11/2010 | Bae | H03K 3/356139 327/89 |

* cited by examiner

*Primary Examiner* — Long Nguyen
(74) *Attorney, Agent, or Firm* — Chui-kiu Teresa Wong

(57) ABSTRACT

In certain aspects, a regenerative stage of a sense amplifier includes a first inverter having an input and an output, and a second inverter having an input and an output. The regenerative stage also includes a third inverter having an input, an output coupled to the input of the second inverter, a first supply terminal coupled to a supply rail, and a second supply terminal coupled to the output of the first inverter. The regenerative stage further includes a fourth inverter having an input, an output coupled to the input of the first inverter, a first supply terminal coupled to the supply rail, and a second supply terminal coupled to the output of the second inverter.

20 Claims, 14 Drawing Sheets

US 11,095,273 B1

HIGH-SPEED SENSE AMPLIFIER WITH A DYNAMICALLY CROSS-COUPLED REGENERATION STAGE

BACKGROUND

Field

Aspects of the present disclosure relate generally to amplifiers, and more particularly, to sense amplifiers.

Background

Sense amplifiers are used in a wide range of applications including memories, analog-to-digital converters, and data samplers in high-speed serializer/deserializer (SerDes). In the case of data samplers, sense amplifiers with strong regenerative feedback may be used to quickly sample and resolve incoming data bits in the data samplers.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a regeneration stage of a sense amplifier. The regeneration stage includes a first inverter having an input and an output, and a second inverter having an input and an output. The regeneration stage also includes a third inverter having an input, an output, a first supply terminal, and a second supply terminal, wherein the output of the third inverter is coupled to the input of the second inverter, the first supply terminal of the third inverter is coupled to a supply rail, and the second supply terminal of the third inverter is coupled to the output of the first inverter. The regeneration stage further includes a fourth inverter having an input, an output, a first supply terminal, and a second supply terminal, wherein the output of the fourth inverter is coupled to the input of the first inverter, the first supply terminal of the fourth inverter is coupled to the supply rail, and the second supply terminal of the fourth inverter is coupled to the output of the second inverter.

A second aspect relates to a method for operation of a regeneration stage of a sense amplifier, the regeneration stage including a first inverter and a second inverter. The method includes, in a first phase, disabling cross-coupling of the first inverter and the second inverter, and, in a second phase, enabling the cross-coupling of the second inverter and the second inverter.

A third aspects relates a system. The system includes a receiver, a latch, and a sense amplifier coupled between the receiver and the latch, wherein the sense amplifier includes an input stage and a regeneration stage coupled to the input stage. The regeneration stage includes a first inverter having an input and an output, and a second inverter having an input and an output. The regeneration stage also includes a third inverter having an input, an output, a first supply terminal, and a second supply terminal, wherein the output of the third inverter is coupled to the input of the second inverter, the first supply terminal of the third inverter is coupled to a supply rail, and the second supply terminal of the third inverter is coupled to the output of the first inverter. The regeneration stage further includes a fourth inverter having an input, an output, a first supply terminal, and a second supply terminal, wherein the output of the fourth inverter is coupled to the input of the first inverter, the first supply terminal of the fourth inverter is coupled to the supply rail, and the second supply terminal of the fourth inverter is coupled to the output of the second inverter.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
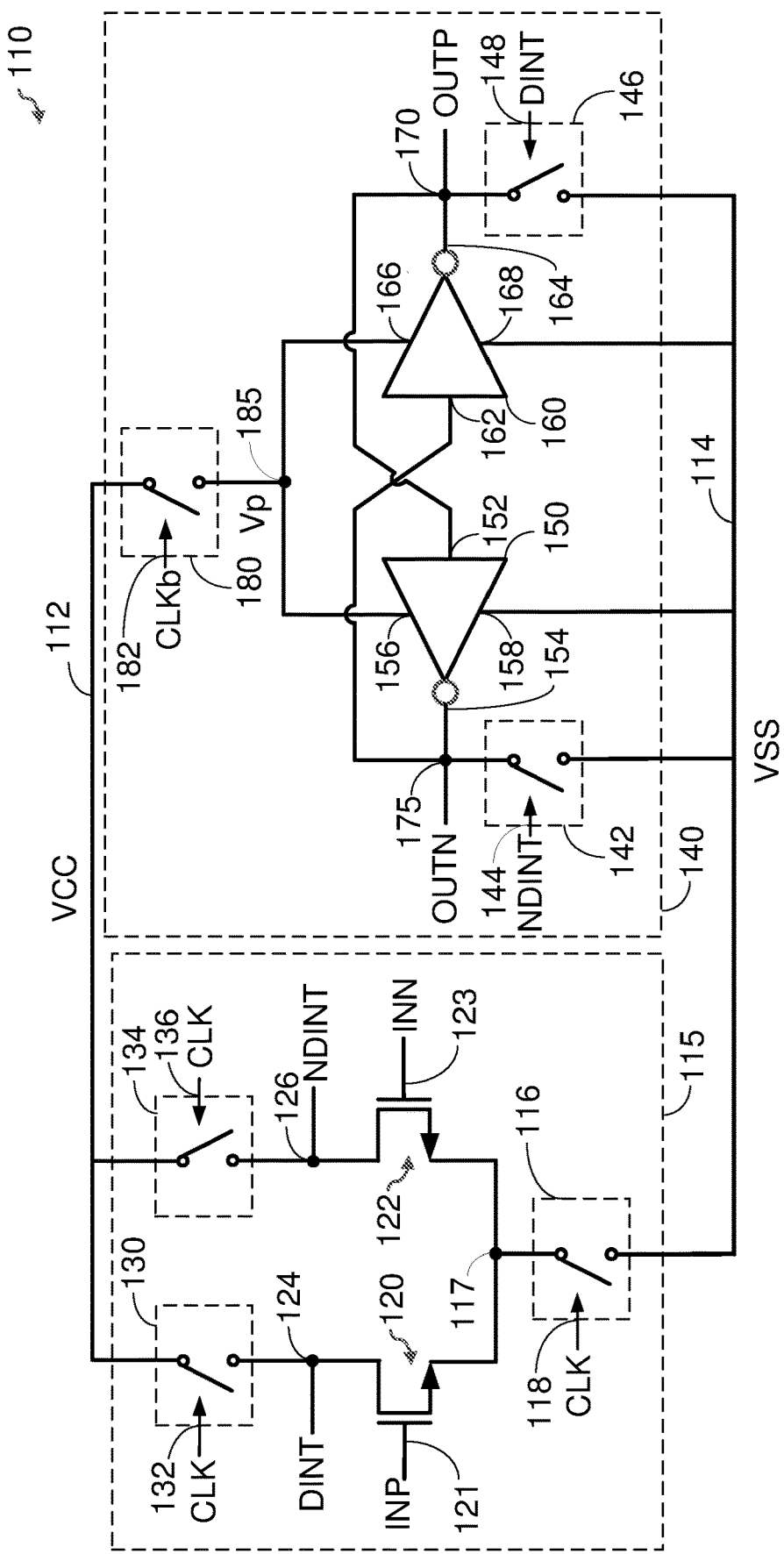
FIG. 1 shows an example of a sense amplifier including an input stage and a regeneration stage according to certain aspects of the present disclosure.

FIG. 1 shows an example of a sense amplifier 110 according to certain aspects of the present disclosure. The sense amplifier 110 includes an input stage 115 and a regeneration stage 140.

The input stage 115 includes a first input transistor 120, a second input transistor 122, a first input-stage switch 116, a second input-stage switch 130, and a third input-stage switch 134. The second input-stage switch 130 is coupled between a supply rail 112 and the first input transistor 120, and the third input-stage switch 134 is coupled between the supply rail 112 and the second input transistor 122. The first input transistor 120 is coupled between the second input-stage switch 130 and internal node 117, and the second input transistor 122 is coupled between the third input-stage switch 134 and internal node 117. The first input-stage switch 116 is coupled between internal node 117 and a ground rail 114.

In the example in FIG. 1, the first input transistor 120 is implemented with a first n-type field effect transistor (NFET) in which the drain of the first input transistor 120 is coupled to the second input-stage switch 130 and the source of the first input transistor 120 is coupled to the first input-stage switch 116. The second input transistor 122 is implemented with a second NFET in which the drain of the second input transistor 122 is coupled to the third input-stage switch 134 and the source of the second input transistor 122 is coupled to the first input-stage switch 116. It is to be appreciated that the first input transistor 120 and the second input transistor 122 are not limited to NFETs and may be implemented with other types of transistors. For example, in other implementations, the first input transistor 120 and the second input transistor 122 may be implemented with p-type field effect transistors (PFETs) by flipping the structure of the input stage 115.

The first input transistor 120 and the second input transistor 122 are driven by a differential input signal (e.g., differential data signal) that includes a first input voltage (labeled "INP") and a second input voltage (labeled "INN"). The first input voltage INP is input to a first input 121 coupled to the gate of the first input transistor 120 and the second input voltage INN is input to a second input 123 coupled to the gate of the second input transistor 122. The differential input signal may have a small differential voltage (i.e., small difference between the first input voltage INP and the second input voltage INN) in which the polarity of the differential voltage represents a bit value. As discussed further below, the sense amplifier 110 is configured to convert the small differential input voltage into a large differential output voltage to resolve the bit value.

The first input-stage switch 116 has a control input 118 driven by a clock signal (labeled "CLK"). In this example, the first input-stage switch 116 is configured to turn on when the clock signal CLK is high and turn off when the clock signal CLK is low.

The second input-stage switch 130 has a control input 132 driven by the clock signal CLK, and the third input-stage switch 134 has a control input 136 driven by the clock signal CLK. In this example, each of the second input-stage switch 130 and the third input-stage switch 134 is configured to turn on when the clock signal CLK is low and turn off when the clock signal CLK is high.

The input stage 115 has a first node 124 between the second input-stage switch 130 and the first input transistor 120, and a second node 126 between the third input-stage switch 134 and the second input transistor 122. The voltage at the first node 124 (labeled "DINT") and the voltage at the second node 126 (labeled "NDINT") are output to the regeneration stage 140, as discussed further below.

The regeneration stage 140 includes a first regeneration-stage switch 142, a second regeneration-stage switch 146, a third regeneration-stage switch 180, a first inverter 150, and a second inverter 160. As discussed further below, the first inverter 150 and the second inverter 160 are cross coupled to provide regenerative feedback.

The first inverter 150 has an input 152, an output 154, a first supply terminal 156, and a second supply terminal 158. The second inverter 160 has an input 162, an output 164, a first supply terminal 166, and a second supply terminal 168. To cross couple the first inverter 150 and the second inverter 160, the input 152 of the first inverter 150 is coupled to the output 164 of the second inverter 160, and the input 162 of the second inverter 160 is coupled to the output 154 of the first inverter 150. The first supply terminal 156 of the first inverter 150 and the first supply terminal 166 of the second inverter 160 are coupled to a virtual supply node 185. The second supply terminal 158 of the first inverter 150 and the second supply terminal 168 of the second inverter 160 are coupled to the ground rail 114. In this example, a first output 170 of the regeneration stage 140 is coupled to the output 164 of the second inverter 160, and a second output 175 of the regeneration stage 140 is coupled to the output 154 of the first inverter 150.

The first regeneration-stage switch 142 is coupled between the output 154 of the first inverter 150 and the ground rail 114. The first regeneration-stage switch 142 has a control input 144 coupled to the second node 126 of the input stage 115. Thus, the control input 144 of the first regeneration-stage switch 142 is driven by the voltage NDINT. In this example, the first regeneration-stage switch 142 is configured to turn on when the voltage NDINT is above a threshold voltage of the first regeneration-stage switch 142 and turn off when the voltage NDINT is below the threshold of the first regeneration-stage switch 142.

The second regeneration-stage switch 146 is coupled between the output 164 of the second inverter 160 and the ground rail 114. The second regeneration-stage switch 146 has a control input 148 coupled to the first node 124 of the input stage 115. Thus, the control input 148 of the second regeneration-stage switch 146 is driven by the voltage DINT. In this example, the second regeneration-stage switch 146 is configured to turn on when the voltage DINT is above a threshold voltage of the second regeneration-stage switch 146 and turn off when the voltage DINT is below the threshold of the second regeneration-stage switch 146. The threshold voltage of the second regeneration-stage switch 146 may be approximately equal to the threshold voltage of the first regeneration-stage switch 142.

The third regeneration-stage switch 180 is coupled between the supply rail 112 and the virtual supply node 185. The third regeneration-stage switch 180 has a control input 182 driven by the complement of the clock signal (labeled "CLKb"), which may be generated by inverting the clock signal CLK with an inverter (not shown). In this example, the third regeneration-stage switch 180 is configured to turn on when the complementary clock signal CLKb is low (i.e., the clock signal CLK is high) and turn off when the complementary clock signal CLKb is high (i.e., the clock signal CLK is low).

Figure 2:
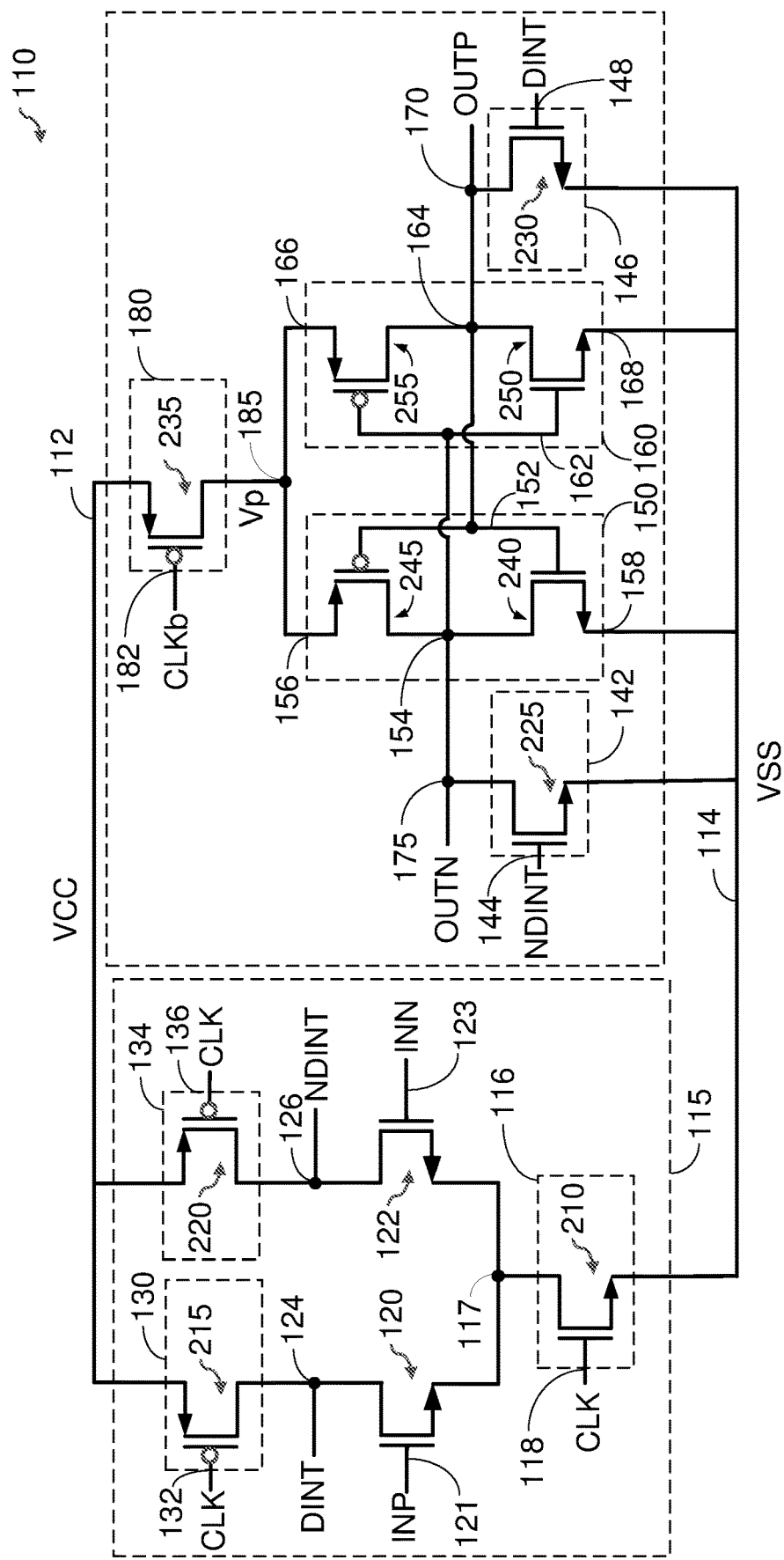
FIG. 2 shows an example in which switches in the sense amplifier of FIG. 1 are implemented with transistors according to certain aspects of the present disclosure.

FIG. 2 shows an example in which the first input-stage switch 116 is implemented with an NFET 210 in which the drain of the NFET 210 is coupled to internal node 117, the source of the NFET 210 is coupled to the ground rail 114, and the control input 118 of the first input-stage switch 116 is located at the gate of the NFET 210. The second input-stage switch 130 is implemented with a PFET 215 in which the source of the PFET 215 is coupled to the supply rail 112, the drain of the PFET 215 is coupled to the first node 124, and the control input 132 of the second input-stage switch 130 is located at the gate of the PFET 215. The third input-stage switch 134 is implemented with a PFET 220 in which the source of the PFET 220 is coupled to the supply rail 112, the drain of the PFET 220 is coupled to the second node 126, and the control input 136 of the third input-stage switch 134 is located at the gate of the PFET 220.

In the example in FIG. 2, the first regeneration-stage switch 142 is implemented with an NFET 225 in which the drain of the NFET 225 is coupled to the output 154 of the first inverter 150, the source of the NFET 225 is coupled to the ground rail 114, and the control input 144 of the first regeneration-stage switch 142 is located at the gate of the NFET 225. In this example, the threshold voltage of the first regeneration-stage switch 142 corresponds to the threshold voltage of the NFET 225. The second regeneration-stage switch 146 is implemented with an NFET 230 in which the drain of the NFET 230 is coupled to the output 164 of the second inverter 160, the source of the NFET 230 is coupled to the ground rail 114, and the control input 148 of the second regeneration-stage switch 146 is located at the gate of the NFET 230. In this example, the threshold voltage of the second regeneration-stage switch 146 corresponds to the threshold voltage of the NFET 230. The third regeneration-stage switch 180 is implemented with a PFET 235 in which the source of the PFET 235 is coupled to the supply rail 112, the drain of the PFET 235 is coupled to the virtual supply node 185, and the control input 182 of the third regeneration-stage switch 180 is located at the gate of the PFET 235.

In the example in FIG. 2, the first inverter 150 includes an NFET 240 and a PFET 245. The drain of the NFET 240 is coupled to the output 154, the gate of the NFET 240 is coupled to the input 152, and the source of the NFET 240 is coupled to the second supply terminal 158. The source of the PFET 245 is coupled to the first supply terminal 156, the drain of the PFET 245 is coupled to the output 154, and the gate of the PFET 245 is coupled to the input 152.

The second inverter 160 includes an NFET 250 and a PFET 255. The drain of the NFET 250 is coupled to the output 164, the gate of the NFET 250 is coupled to the input 162, and the source of the NFET 250 is coupled to the second supply terminal 168. The source of the PFET 255 is coupled to the first supply terminal 166, the drain of the PFET 255 is coupled to the output 164, and the gate of the PFET 255 is coupled to the input 162.

It is to be appreciated that the switches 116, 130, 134, 142, 146 and 180 are not limited to the exemplary implementations shown in FIG. 2. Also, it is to be appreciated that the first inverter 150 and the second inverter 160 are not limited to the exemplary implementations shown in FIG. 2.

Exemplary operations of the sense amplifier 110 will now be discussed according to certain aspects.

When the clock signal CLK is low, the sense amplifier 110 is in a reset phase in which nodes of the sense amplifier 110 are set to predetermined voltages to initialize the sense amplifier 110 for the next bit decision. In the reset phase, the first input-stage switch 116 is turned off. As a result, the first input-stage switch 116 decouples the first and second input transistors 120 and 122 from the ground rail 114. The second input-stage switch 130 is turned on and the third input-stage switch 134 is turned on. As a result, the second input-stage switch 130 pulls the first node 124 to VCC (i.e., the supply voltage on the supply rail 112) and the third input-stage switch 134 pulls the second node 126 to VCC. Thus, the voltages NDINT and DINT input to the first and second regeneration-stage switches 142 and 146, respectively, of the regeneration stage 140 are both pulled to VCC.

In the reset phase, the third regeneration-stage switch 180 is turned off since the complementary clock signal CLKb is high when the clock signal CLK is low. As a result, the third regeneration-stage switch 180 decouples the first supply terminal 156 of the first inverter 150 from the supply rail 112 and decouples the first supply terminal 166 of the second inverter 160 from the supply rail 112. This disables the current paths from the supply rail 112 to the first supply terminals 156 and 166 of the inverters 150 and 160.

In the reset phase, the first and second regeneration-stage switches 142 and 146 are both turned on since DINT and NDINT are both pulled to VCC (assuming VCC is greater than the threshold voltages of the switches 142 and 146). As a result, the first regeneration-stage switch 142 pulls the output 154 of the first inverter 150 and the input 162 of the second inverter 160 to ground, and the second regeneration-stage switch 146 pulls the output 164 of the second inverter 160 and the input 152 of the first inverter 150 to ground.

Figure 3:
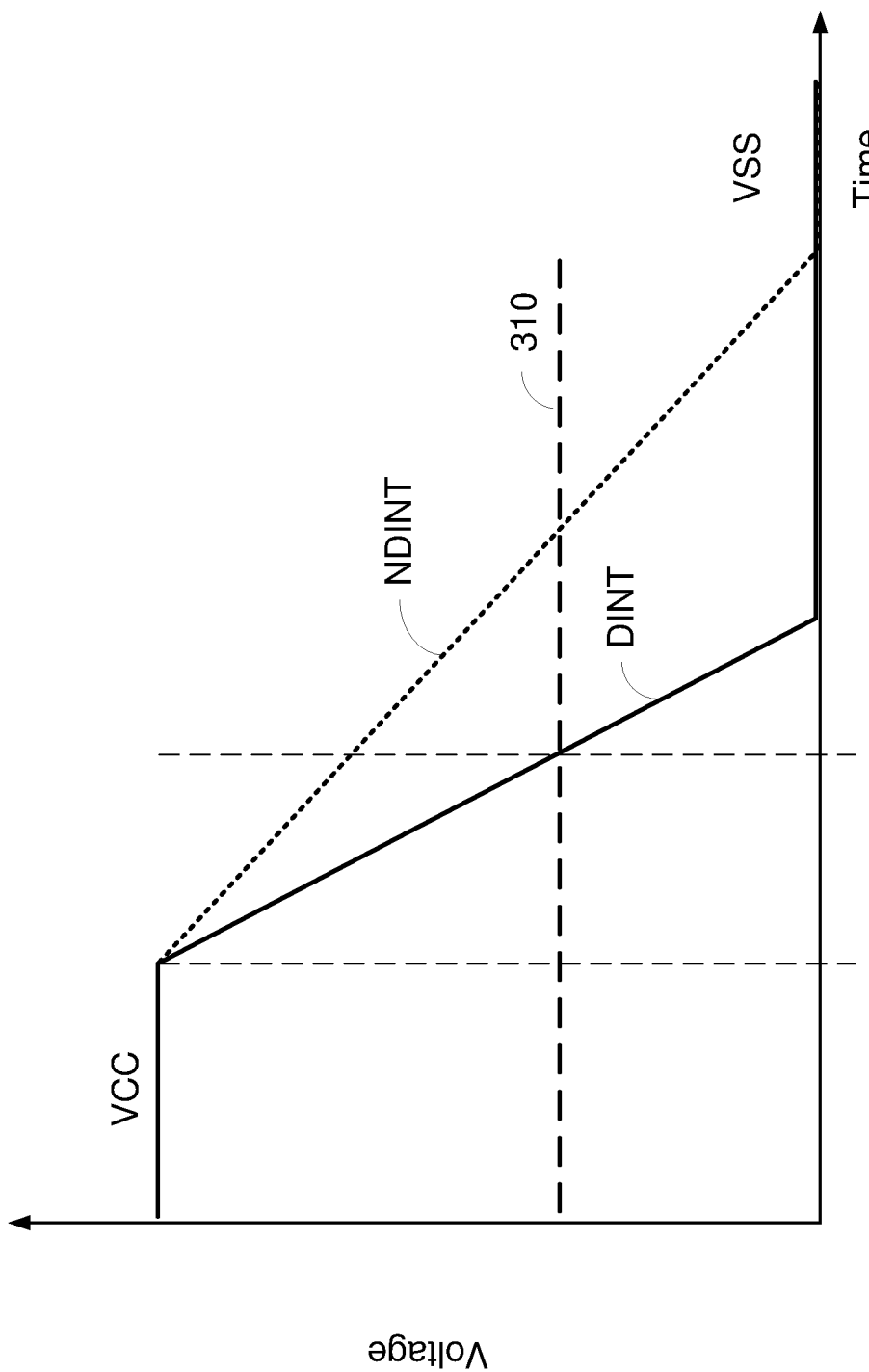
FIG. 3 is a timing diagram showing an example of voltages output by the input stage to the regeneration stage according to certain aspects of the present disclosure.

When the clock signal CLK transitions from low to high, the sense amplifier 110 enters a sensing phase in which the input-stage 115 senses the differential input signal (e.g., differential data signal). FIG. 3 shows an example of the voltages DINT and NDINT during the sensing phase for the case where the input voltage INP is higher than the input voltage INN, which may represent a bit value of one. In this example, the clock signal CLK transitions from low to high at time T1. FIG. 3 also shows the threshold voltage 310 for the first and second regeneration-stage switches 142 and 146.

At time T1, the first input-stage switch 116 turns on, and the second input-stage switch 130 and the third input-stage switch 134 turn off. This allows the first input transistor 120 to pull down the voltage DINT at the first node 124 based on the input voltage INP driving the first input transistor 120, and the second input transistor 122 to pull down the voltage NDINT at the second node 126 based on the input voltage INN driving the first second transistor 122. In this example, the voltage DINT at the first node 124 is pulled down at a faster rate than the voltage NDINT at the second node 126. This is because the first input transistor 120 is driven by a higher voltage than the second transistor 122 in this example (i.e., INP>INN).

Figure 4:
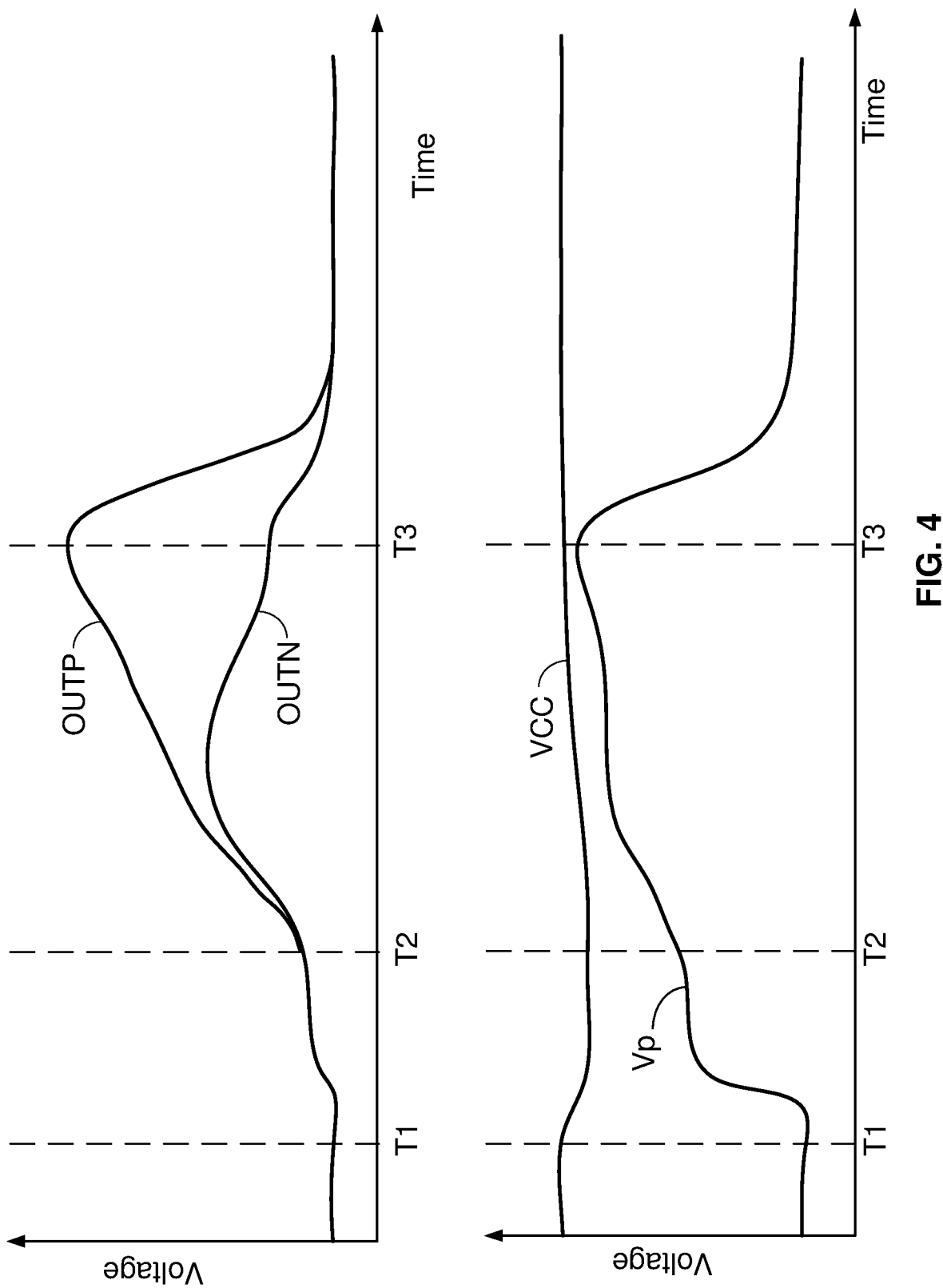
FIG. 4 is a timing diagram showing an example of output voltages of the regeneration stage during a sensing phase and a decision phase according to certain aspects of the present disclosure.

At time T2, the voltage DINT falls below the threshold voltage 310, which turns off the second regeneration-stage switch 146. The first regeneration-stage switch 142 is still turned on at time T2 since the voltage NDINT is still above the threshold voltage. At time T2, the regeneration stage 140 enters a decision phase in which the turning off of the second regeneration-stage switch 146 triggers the regenerative feedback of the cross-coupled inverters 150 and 160. In this example, the regenerative feedback pulls up the first output 170 and pulls down the second output 175. An example of this is illustrated in FIG. 4, which shows an example of the output voltage OUTP at the first output 170 and the output voltage OUTN at the second output 175. As shown in FIG. 4, the regenerative feedback pulls up the first output 170 and pulls down the second output 175 resulting in a large differential output voltage at the outputs 170 and 175 representing the resolved bit value. In this example, the output voltage OUTP is higher than the output voltage OUTN, which may represent a bit decision of one.

At time T3, the clock signal CLK transitions from high back to low, causing each of the output voltages OUTP and OUTN to return to the reset voltage of approximately zero volts (i.e., ground).

The sensing phase and decision phase are discussed above for the case where the input voltage INP is higher than the input voltage INN. For the case where the input voltage INN is higher than the input voltage INP, the voltage NDINT at the second node 126 of the input stage 115 falls below the threshold voltage 310 before the voltage DINT at the first node 124 of the input stage 115 during the sensing phase, causing the first regeneration-stage switch 142 to turn off. The turning off of the first regeneration-stage switch 142 causes the regenerative feedback of the cross-coupled inverters 150 and 160 to pull up the second output 175 and pull down the first output 170, resulting in a large differential output voltage in which the output voltage OUTN is higher than the output voltage OUTP, which may represent a bit decision of zero.

The cross-coupled inverters 150 and 160 provide regenerative gain when the first supply terminals 156 and 166 of the cross-coupled inverters 150 and 160 are coupled to the supply rail 112 through the third regeneration-stage switch 180. The cross-coupled inverters 150 and 160 may draw a large current from the supply rail 112 through the third regeneration-stage switch 180 during the sensing phase, causing a large IR voltage drop to appear across the third regeneration-stage switch 180. The large IR voltage drop reduces the supply voltage (labeled "Vp") at the first supply terminals 156 and 166 of the cross-coupled inverters 150 and 160. An example of this is illustrated in FIG. 4, which shows an example of the supply voltage VCC at the supply rail 122 and the supply voltage Vp at the virtual supply node 185, which is coupled to the first supply terminals 156 and 166 of the inverters 150 and 160. As shown in FIG. 4, at the start of the decision phase at time T2, the supply voltage Vp at the virtual supply node 185 may be substantially lower (e.g., over 30 percent lower) than the supply voltage VCC at the supply rail 122 due to the IR drop across the third regeneration-stage switch 180. The lower supply voltage Vp may substantially reduce the regenerative gain of the cross-coupled inverters 150 and 160, which substantially slows down the speed with which the regeneration stage 140 can render a bit decision and reduces the sensitivity of the sense amplifier 110.

To address the above, aspects of the present disclosure provide a regeneration stage including clock-driven inverters that dynamically control the cross-coupling of the inverters 150 and 160. This eliminates the need for the third regeneration-stage switch 180, which allows the first supply terminals 156 and 166 of the inverters 150 and 160 to be coupled directly to the supply rail 112. As a result, the supply voltage VCC is applied to the first supply terminals 156 and 166 of the inverters 150 and 160, which increases the regenerative gain of the cross-coupled inverters 150 and 160 during the decision phase. The increased regenerative gain increases the speed with which the regeneration stage can render a bit decision and increases the sensitivity of the sense amplifier 110. Further, the regeneration stage may include regenerative switches to further increase regenerative gain, as discussed further below.

Figure 5:
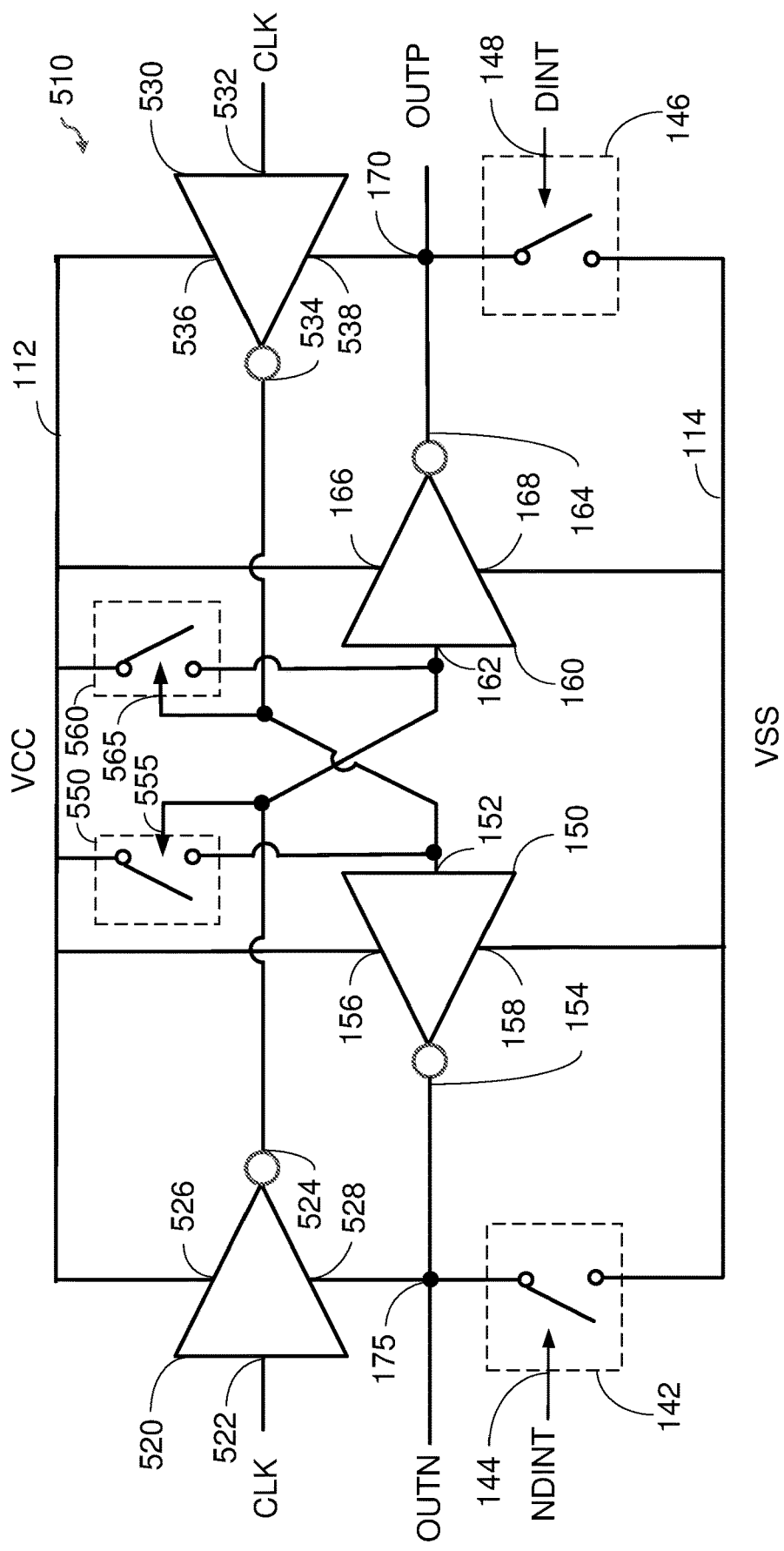
FIG. 5 shows an example of a sense amplifier according to certain aspects of the present disclosure.

FIG. 5 shows an exemplary regeneration stage 510 according to certain aspects of the present disclosure. The regeneration stage 510 may be coupled to the exemplary input stage 115 shown in FIG. 1 or FIG. 2. The regeneration stage 510 includes the first inverter 150, the second inverter 160, the first regeneration-stage switch 142, and the second regeneration-stage switch 146 discussed above.

The regeneration stage 510 also includes a third inverter 520 and a fourth inverter 530. Each of the third inverter 520 and the fourth inverter 530 is driven by the clock signal CLK. As discussed further below, the third inverter 520 and the fourth inverter 530 are configured to control the cross-coupling of the first inverter 150 and the second inverter 160 based on the clock signal CLK.

The regeneration stage 510 also includes a first regenerative switch 550 and a second regenerative switch 560. As discussed further below, the first regenerative switch 550 and the second regenerative switch 560 are configured to provide additional regenerative gain during the decision phase.

In the example in FIG. 5, the first supply terminal 156 of the first inverter 150 and the first supply terminal 166 of the second inverter 160 are coupled to the supply rail 112. In this example, the supply voltage VCC is applied to the first supply terminals 156 and 166 of the first and second inverters 150 and 160. The second supply terminal 158 of the first inverter 150 and the second supply terminal 168 of the second inverter 160 are coupled to the ground rail 114.

The first regeneration-stage switch 142 is coupled between the output 154 of the first inverter 150 and the ground rail 114. The control input 144 of the first regeneration-stage switch 142 may be coupled to the second node 126 of the input stage 115, as discussed above. The second regeneration-stage switch 146 is coupled between the output 164 of the second inverter 160 and the ground rail 114. The control input 148 of the second regeneration-stage switch 146 may be coupled to the first node 124 of the input stage 115, as discussed above.

The third inverter 520 has an input 522, an output 524, a first supply terminal 526, and a second supply terminal 528. The input 522 of the third inverter 520 is driven by the clock signal CLK, and the output 524 of the third inverter 520 is coupled to the input 162 of the second inverter 160. The first supply terminal 526 of the third inverter 520 is coupled to the supply rail 112, and the second supply terminal 528 of the third inverter 520 is coupled to the output 154 of the first inverter 150.

The fourth inverter 530 has an input 532, an output 534, a first supply terminal 536, and a second supply terminal 538. The input 532 of the fourth inverter 530 is driven by the clock signal CLK, and the output 534 of the fourth inverter 530 is coupled to the input 152 of the first inverter 150. The first supply terminal 536 of the fourth inverter 530 is coupled to the supply rail 112, and the second supply terminal 538 of the fourth inverter 530 is coupled to the output 164 of the second inverter 160.

The first regenerative switch 550 is coupled between the supply rail 112 and the input 152 of the first inverter 150. The first regenerative switch 550 has a control input 555 coupled to the output 524 of the third inverter 520. The second regenerative switch 560 is coupled between the supply rail 112 and the input 162 of the second inverter 160. The second regenerative switch 560 has a control input 565 coupled to the output 534 of the fourth inverter 530. Each of the regenerative switches 550 and 560 may be implemented with a PFET or another type of switch.

In the example shown in FIG. 5, the first output 170 of the regeneration stage 510 is coupled to the output 164 of the second inverter 160, and the second output 175 of the regeneration stage 510 is coupled to the output 154 of the first inverter 150. However, it is to be appreciated that the regeneration stage 510 is not limited to this example, and that the outputs 170 and 175 may be coupled to other nodes in the regeneration stage 510 (e.g., coupled to the outputs 524 and 534 of the third and fourth inverters 520 and 530).

Exemplary operations of the regeneration stage 510 will now be discussed according to certain aspects of the present disclosure.

When the clock signal CLK is low, the regeneration stage 510 is in the reset phase. In the reset phase, current paths from the supply rail 112 to the ground rail 114 are disabled, and nodes of the regeneration stage 510 are set to predetermined voltages to initialize the regeneration stage 510 for the next bit decision, as discussed further below.

In the reset phase, the third inverter 520 pulls the input 162 of the second inverter 160 to the supply voltage VCC, and the fourth inverter 530 pulls the input 152 of the first inverter 150 to the supply voltage VCC. In this case, the third inverter 520 and the fourth inverter 530 break the cross-coupling paths between the first inverter 150 and the second inverter 160 (i.e., disable the cross-coupling of the first inverter 150 and the second inverter 160). Since the inputs 152 and 162 of the first and second inverters 150 and 160 are pulled to VCC, the outputs 154 and 164 of the first and second inverters 150 and 160 are driven low.

In addition, in the reset phase, the first regeneration-stage switch 142 and the second regeneration-stage switch 146 are both turned on. This is because the voltages NDINT and DINT are pulled to VCC in the reset phase, as discussed above.

When the clock signal CLK transitions from low to high at the beginning of the sensing phase, the third inverter 520 couples the input 162 of the second inverter 160 to the output 154 of the first inverter 150. This is because, when the clock signal CLK is high, the third inverter 520 creates a conduction path between the output 524 of the third inverter 520 and the second supply terminal 528 of the third inverter 520. Since the output 524 of the third inverter 520 is coupled to the input 162 of the second inverter 160 and the second supply terminal 528 of the third inverter 520 is coupled to the output 154 of the first inverter 150, the conduction path couples the input 162 of the second inverter 160 to the output 154 of the first inverter 150.

Also, the fourth inverter 530 couples the input 152 of the first inverter 150 to the output 164 of the second inverter 160. This is because, when the clock signal CLK is high, the fourth inverter 530 creates a conduction path between the output 534 of the fourth inverter 530 and the second supply terminal 538 of the fourth inverter 530. Since the output 534 of the fourth inverter 530 is coupled to the input 152 of the first inverter 150 and the second supply terminal 538 of the fourth inverter 530 is coupled to the output 164 of the second inverter 160, the conduction path couples the input 152 of the first inverter 150 to the output 164 of the second inverter 160.

Thus, when the clock signal CLK is high, the third inverter 520 couples the input 162 of the second inverter 160 to the output 154 of the first inverter 150, and the fourth inverter 530 couples the input 152 of the first inverter 150 to the output 164 of the second inverter 160. As a result, the third inverter 520 and the fourth inverter 530 enable the cross-coupling of the first inverter 150 and the second inverter 160, which enables regenerative feedback.

As discussed above, during the sensing phase, the voltages NDINT and DINT input to the first regeneration-stage switch 142 and the second regeneration-stage switch 146, respectively, fall at different rates depending on the polarity of the differential input signal.

In the case where the voltage DINT falls faster than the voltage NDINT (i.e., INP>INN), the voltage DINT falls below the threshold voltage first, causing the second regeneration-stage switch 146 to turn off first. The turning off of the second regeneration-stage switch 146 triggers the regenerative feedback of the cross-coupled inverters 150 and 160 to pull the first output 170 high and pull the second output 175 low. Since the supply voltage VCC is applied to the first supply terminals 156 and 166 of the first inverter 150 and the second inverter 160, the regenerative gain is high, allowing the regeneration stage 510 to more quickly pull the first output 170 high and pull the second output 175 low for a faster bit decision. In contrast, in the regeneration stage 140 in FIGS. 1 and 2, the supply voltage Vp applied to the first supply terminals 156 and 166 of the first inverter 150 and the second inverter 160 is lower due to the IR voltage drop across the third regeneration-stage switch 180, which decreases the regenerative gain.

For the example where the regenerative switches 550 and 560 are implemented with PFETs, the pulling down of the second output 175 causes the first regenerative switch 550 to turn on. As a result, the first regenerative switch 550 pulls the input 152 of the first inverter 150 to VCC, which helps the first inverter 150 pull down the second output 175 and increase the regenerative gain.

In the case where the voltage NDINT falls faster than the voltage DINT (i.e., INN>INP), the voltage NDINT falls below the threshold voltage first, causing the first regeneration-stage switch 142 to turn off first. The turning off of the first regeneration-stage switch 142 triggers the regenerative feedback of the cross-coupled inverters 150 and 160 to pull the second output 175 high and pull the first output 170 low. Since the supply voltage VCC is applied to the first supply terminals 156 and 166 of the first inverter 150 and the second inverter 160, the regenerative gain is high, allowing the regeneration stage 510 to more quickly pull the second output 175 high and pull the first output 170 low for a faster bit decision.

For the example where the regenerative switches 550 and 560 are implemented with PFETs, the pulling down of the first output 170 causes the second regenerative switch 560 to turn on. As a result, the second regenerative switch 560 pulls the input 162 of the second inverter 160 to VCC, which helps the second inverter 160 pull down the first output 170 and increase the regenerative gain.

Figure 6:
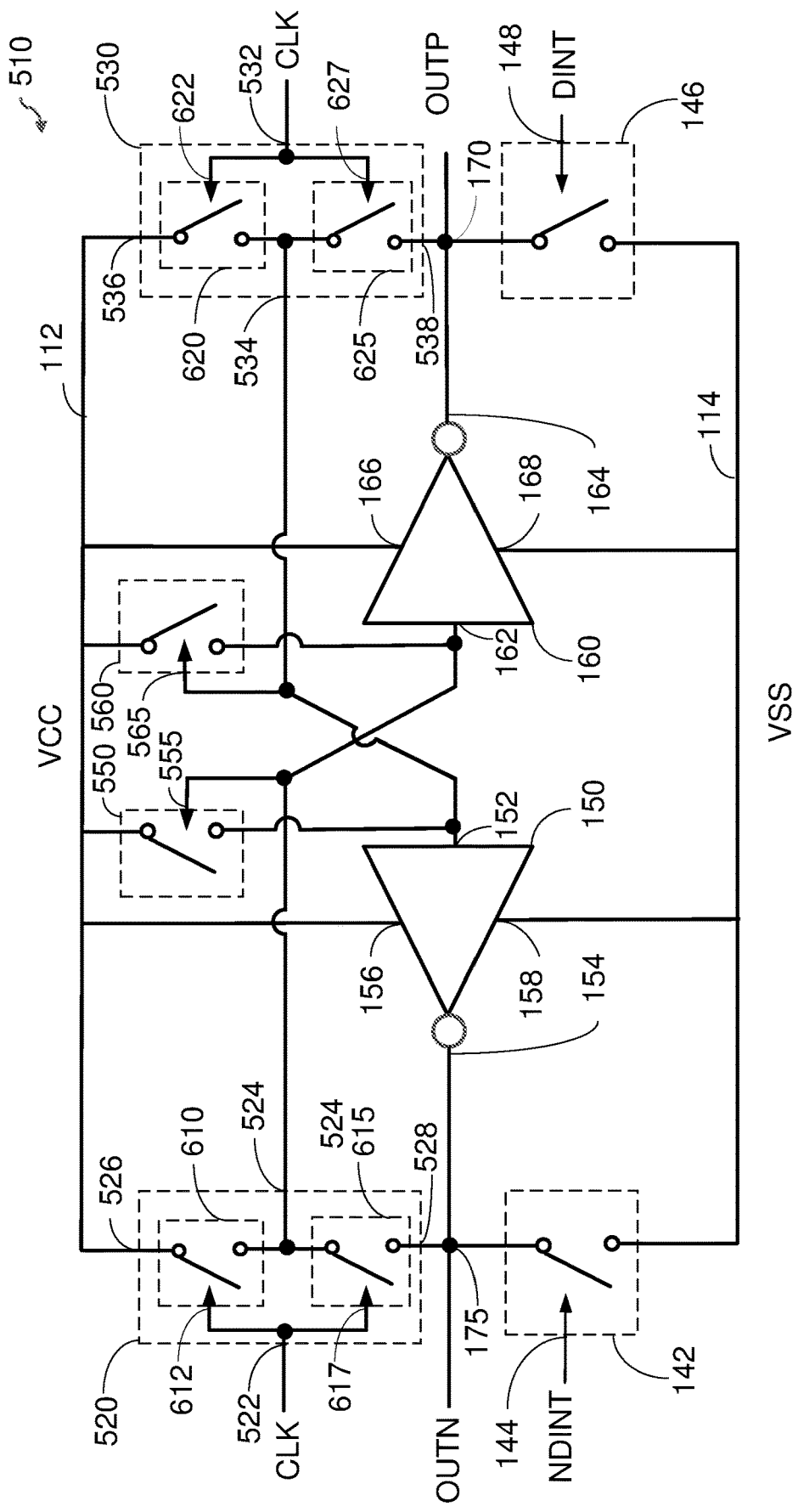
FIG. 6 shows an example in which inverters in the sense amplifier of FIG. 6 are implemented with switches according to certain aspects of the present disclosure.

FIG. 6 shows exemplary implementations of the third inverter 520 and the fourth inverter 530 according to certain aspects. In this example, the third inverter 520 includes a first switch 610 and a second switch 615. The first switch 610 is coupled between the first supply terminal 526 and the output 524 of the third inverter 520, and the second switch 615 is coupled between the output 524 and the second supply terminal 528 of the third inverter 520. The control input 612 of the first switch 610 and the control input 617 of the second switch 615 are coupled to the input 522 of the third inverter 520. The first switch 610 is configured to turn on when the clock signal CLK is low and turn off when the clock signal CLK is high, and the second switch 615 is configured to turn off when the clock signal CLK is low and turn on when the clock signal CLK is high. Thus, when the clock signal CLK is low (i.e., the input 522 is low), the first switch 610 is turned on and the second switch 615 is turned off, and, when the clock signal CLK is high (i.e., the input 522 is high), the first switch 610 is turned off and the second switch 615 is turned on.

In this example, the fourth inverter 530 includes a third switch 620 and a fourth switch 625. The third switch 620 is coupled between the first supply terminal 536 and the output 534 of the fourth inverter 530, and the fourth switch 625 is coupled between the output 534 and the second supply terminal 538 of the fourth inverter 530. The control input 622 of the third switch 620 and the control input 627 of the fourth switch 625 are coupled to the input 532 of the fourth inverter 530. The third switch 620 is configured to turn on when the clock signal CLK is low and turn off when the clock signal CLK is high, and the fourth switch 625 is configured to turn off when the clock signal CLK is low and turn on when the clock signal CLK is high. Thus, when the clock signal CLK is low (i.e., the input 532 is low), the third switch 620 is turned on and the fourth switch 625 is turned off, and, when the clock signal CLK is high (i.e., the input 532 is high), the third switch 620 is turned off and the fourth switch 625 is turned on.

In this example, when the clock signal CLK is low in the reset phase, the first switch 610 is turned on and the second switch 615 is turned off in the third inverter 520. As a result, the third inverter 520 couples the input 162 of the second inverter 160 to supply rail 112 through the first switch 610, which pulls up the input 162 of the second inverter 160 to VCC. Since the second switch 615 is turned off, the input 162 of the second inverter 160 is decoupled from the output 154 of the first inverter 150.

Also, the third switch 620 is turned on and the fourth switch 625 is turned off in the fourth inverter 530. As a result, the fourth inverter 530 couples the input 152 of the first inverter 150 to the supply rail 112 through the third switch 620, which pulls up the input 152 of the first inverter 150 to VCC. Since the fourth switch 625 is turned off, the input 152 of the first inverter 150 is decoupled from the output 164 of the second inverter 160.

Thus, in the reset phase, the input 162 of the second inverter 160 is decoupled from the output 154 of the first inverter 150, and the input 152 of the first inverter 150 is decoupled from the output 164 of the second inverter 160, which disables the cross-coupling of the first inverter 150 and the second inverter 160.

When the clock signal CLK transitions from low to high at the beginning of the sensing phase, the first switch 610 is turned off and the second switch 615 is turned on in the third inverter 520. As a result, the third inverter 520 couples the input 162 of the second inverter 160 to the output 154 of the first inverter 150 through the second switch 615.

In addition, the third switch 620 is turned off and the fourth switch 625 is turned on in the fourth inverter 530. As a result, the fourth inverter 530 couples the input 152 of the first inverter 150 to the output 164 of the second inverter 160 through the fourth switch 625.

Thus, when the clock signal CLK is high in the sensing phase and decision phase, the input 162 of the second inverter 160 is coupled to the output 154 of the first inverter 150 through the second switch 615, and the input 152 of the first inverter 150 is coupled to the output 164 of the second inverter 160 through the fourth switch 625, which enables the cross-coupling of the first inverter 150 and the second inverter and hence enables the regenerative feedback.

Figure 7:
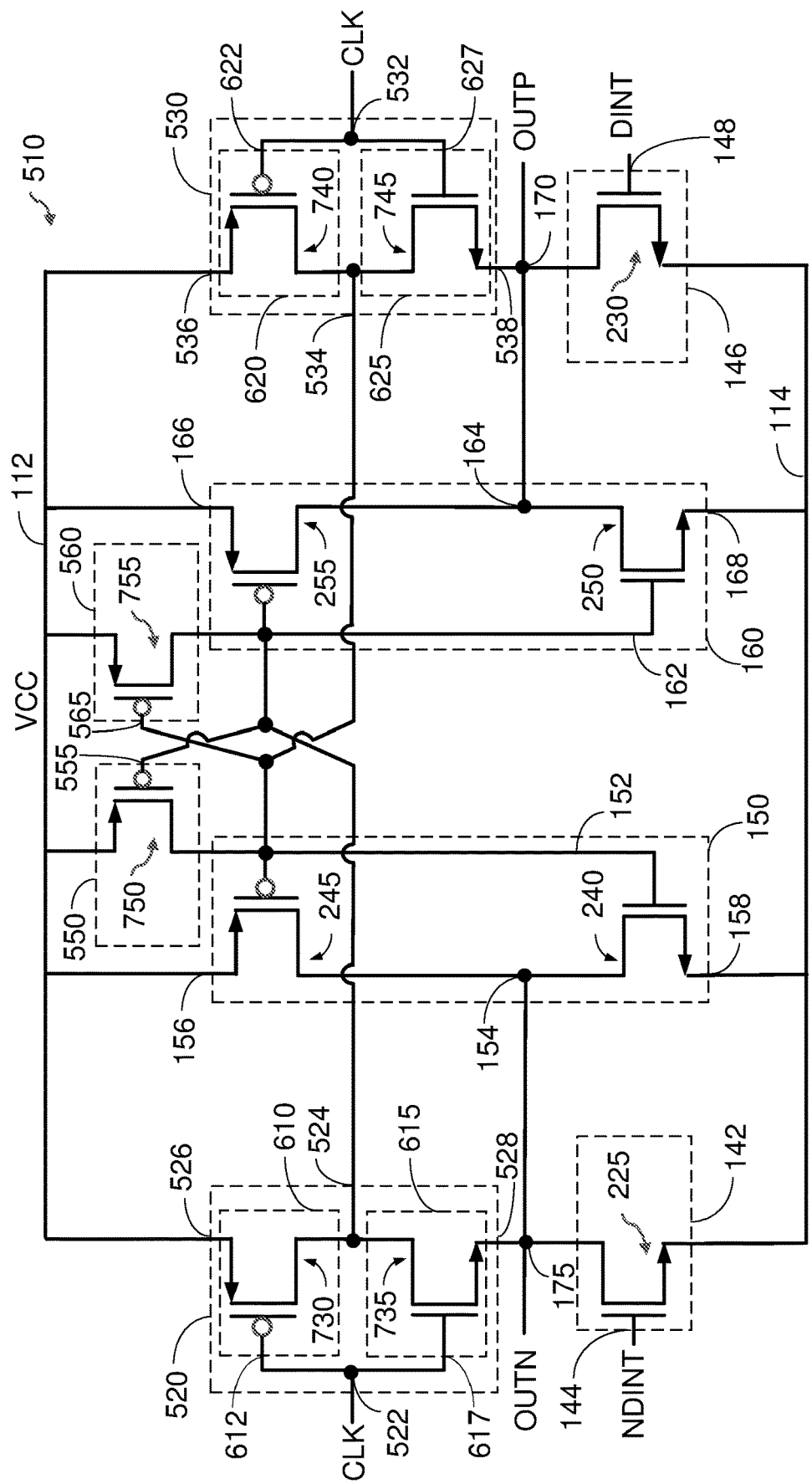
FIG. 7 shows an example in which switches in the sense amplifier of FIG. 7 are implemented with transistors according to certain aspects of the present disclosure.

FIG. 7 shows exemplary implementations of the switches 610, 615, 620, 625, 550 and 560 according to certain aspects. In this example, the first switch 610 is implemented with a PFET 730 in which the source of the PFET 730 is coupled to the first supply terminal 526 of the third inverter 520, the drain of the PFET 730 is coupled to the output 524 of the third inverter 520, and the control input 612 is located at the gate of the PFET 730. The second switch 615 is implemented with an NFET 735 in which the source of the NFET 735 is coupled to the second supply terminal 528, the drain of the NFET 735 is coupled to the output 524 of the third inverter 520, and the control input 617 is located at the gate of the NFET 735.

In this example, the third switch 620 is implemented with a PFET 740 in which the source of the PFET 740 is coupled to the first supply terminal 536 of the fourth inverter 530, the drain of the PFET 740 is coupled to the output 534 of the fourth inverter 530, and the control input 622 is located at the gate of the PFET 740. The fourth switch 625 is implemented with an NFET 745 in which the source of the NFET 745 is coupled to the second supply terminal 538, the drain of the NFET 745 is coupled to the output 534 of the fourth inverter 530, and the control input 627 is located at the gate of the NFET 745.

In this example, the first regenerative switch 550 is implemented with a PFET 750 in which the source of the PFET 750 is coupled to the supply rail 112, the drain of the PFET 750 is coupled to the input 152 of the first inverter 150, and the control input 555 is located at the gate of the PFET 750. The control input 555 is coupled to the output 524 of the third inverter 530.

The second regenerative switch 560 is implemented with a PFET 755 in which the source of the PFET 755 is coupled to the supply rail 112, the drain of the PFET 755 is coupled to the input 162 of the second inverter 160, and the control input 565 is located at the gate of the PFET 755. The control input 565 is coupled to the output 534 of the fourth inverter 530.

In the example shown in FIG. 7, the first regeneration-stage switch 142 is implemented with the NFET 225 discussed above, and the second regeneration-stage switch 146 is implemented with the NFET 230 discussed above. Also, the first inverter 150 is implemented with the NFET 240 and the PFET 245 discussed above, and the second inverter 160 is implemented with the NFET 250 and the PFET 255 discussed above. However, it is to be appreciated that the present disclosure is not limited to these exemplary implementations.

Figure 8A:
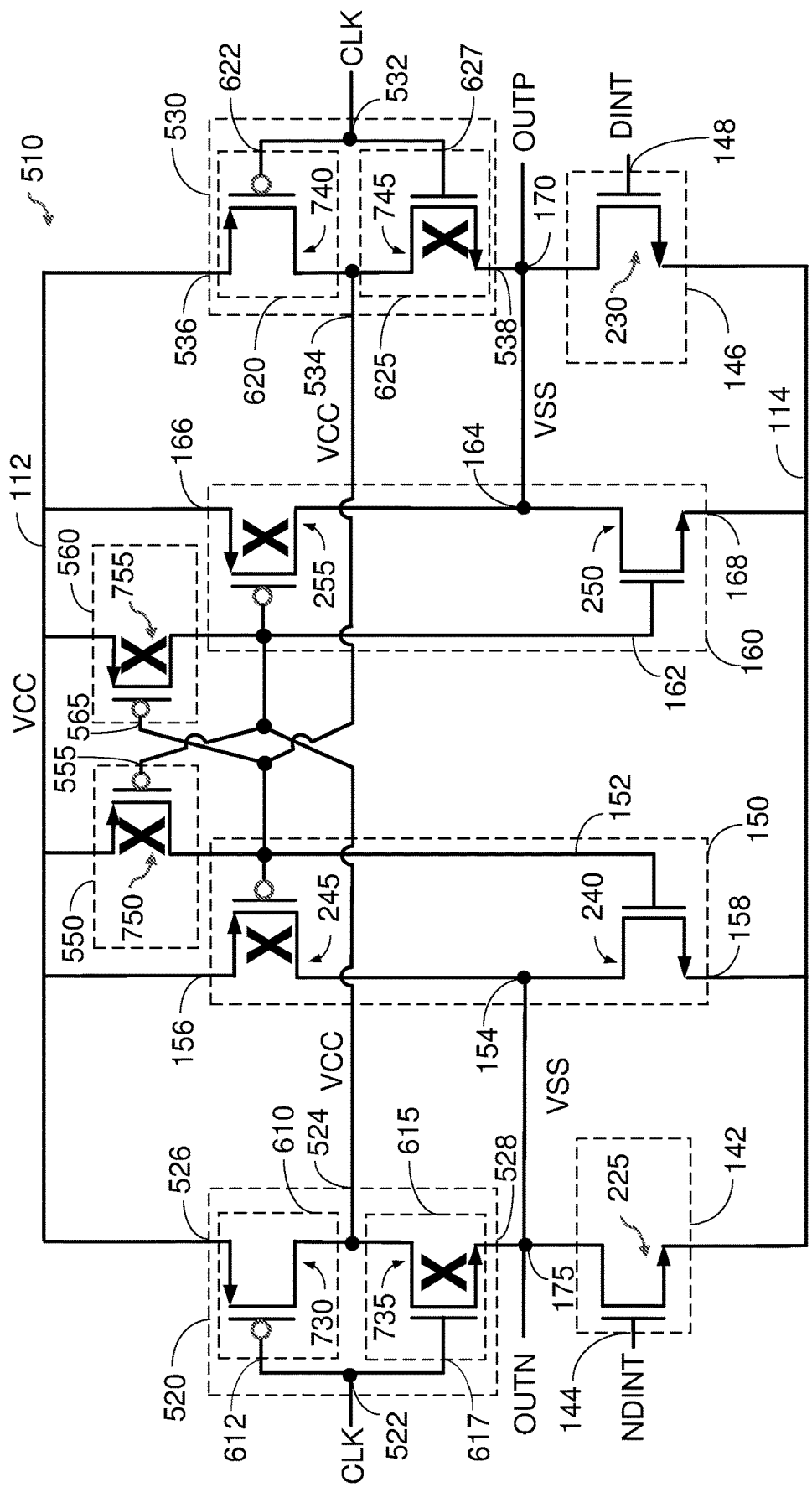
FIG. 8A shows an example of a sense amplifier in a reset phase according to certain aspects of the present disclosure.

FIG. 8A shows an example of the on/off states of the transistors in the regeneration stage 510 in the reset phase according to certain aspects. In FIG. 8A, an "X" next to a transistor indicates that the transistor is turned off.

In this example, the PFET 730 in the third inverter 520 is turned on and thus couples the input 162 of the second inverter 160 to the supply rail 112, pulling the input 162 of the second inverter 160 to VCC. This turns off the PFET 255 and turns on the NFET 250 in the second inverter 160. The NFET 735 of the third inverter 520 is turned off and thus decouples the input 162 of the second inverter 160 from the output 154 of the first inverter 150.

The PFET 740 in the fourth inverter 530 is turned on and thus couples the input 152 of the first inverter 150 to the supply rail 112, pulling the input 152 of the first inverter 150 to VCC. This turns off the PFET 245 and turns on the NFET 240 in the first inverter 150. The NFET 745 of the fourth inverter 530 is turned off and thus decouples the input 152 of the first inverter 150 from the output 164 of the second inverter 160.

The PFET 750 in the first regenerative switch 550 is turned off. This is because the PFET 730 in the third inverter 520 pulls the control input 555 of the first regenerative switch 550 to VCC in this example. The PFET 755 in the second regenerative switch 560 is also turned off. This is because the PFET 740 in the fourth inverter 530 pulls the control input 565 of the second regenerative switch 560 to VCC in this example.

As shown in FIG. 8A, current paths from the supply rail 112 to the ground rail 114 are disabled in the reset phase, allowing nodes in the regeneration stage 510 to settle to predetermined voltages shown in FIG. 8A in the reset phase. The voltage VSS in FIG. 8A indicates the voltage of the ground rail 114.

Figure 8B:
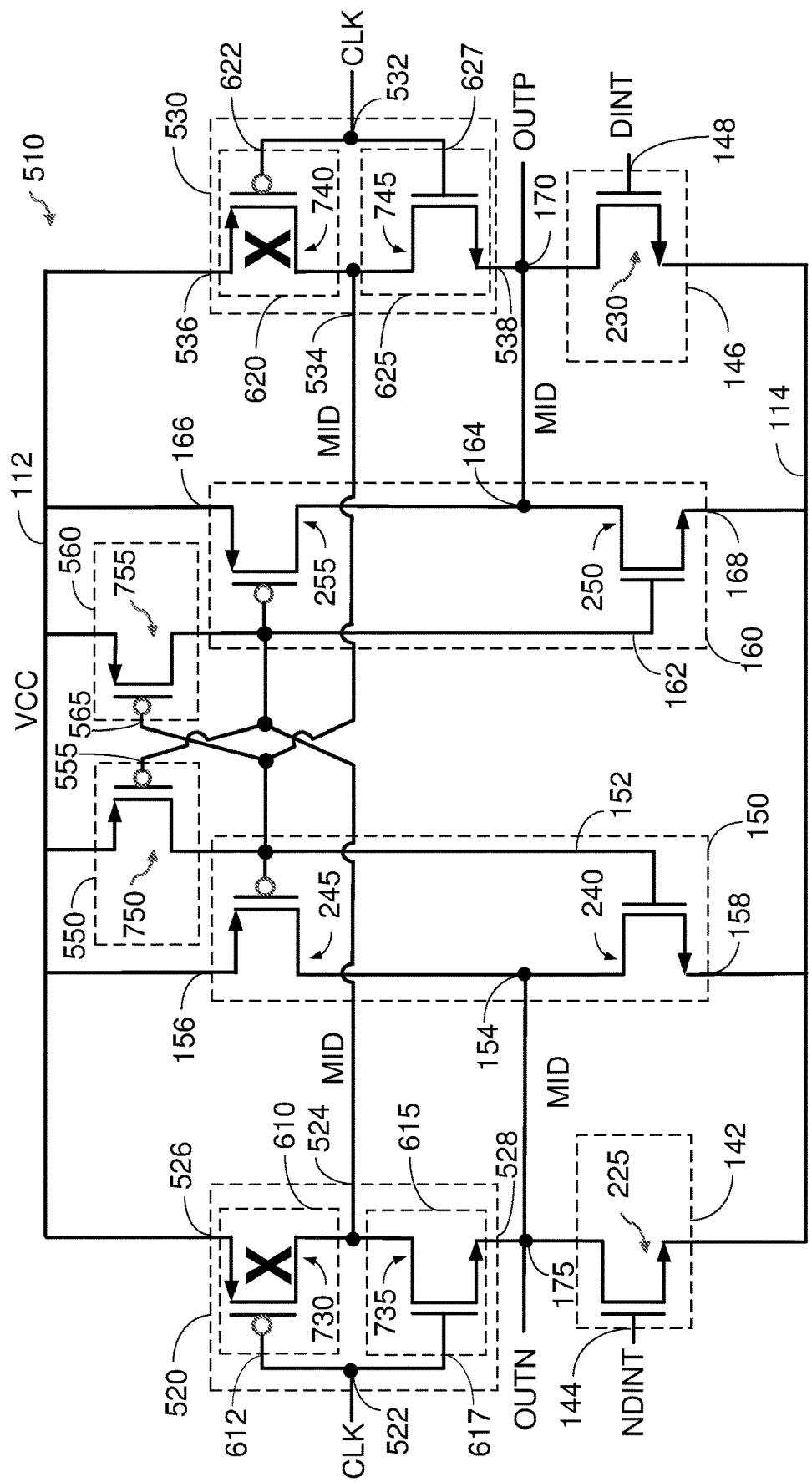
FIG. 8B shows an example of the sense amplifier in a sensing phase according to certain aspects of the present disclosure.

FIG. 8B shows an example of the regeneration stage 510 in the sensing phase according to certain aspects. In this example, the NFET 735 in the third inverter 520 is turned on and thus couples the input 162 of the second inverter 160 to the output 154 of the first inverter 150. The NFET 745 in the fourth inverter 530 is turned on and thus couples the input 152 of the first inverter 150 to the output 164 of the second inverter 160. As a result, the cross-coupling of the inverters 150 and 160 is enabled. The PFETs 730 ad 740 are turned off.

In the sensing phase, current flows through the regeneration stage 510 from the supply rail 112 which pulls the outputs 170 and 175 of the regeneration stage 510 to a voltage between VCC and ground (labeled "MID"). The voltage MID is not necessarily at the exact midpoint between VCC and ground. The outputs 170 and 175 may be held at the voltage MID until one of the voltages DINT and NDINT falls below the threshold voltage causing one of the first and second regeneration-stage switches 142 and 146 to turn off.

Figure 8C:
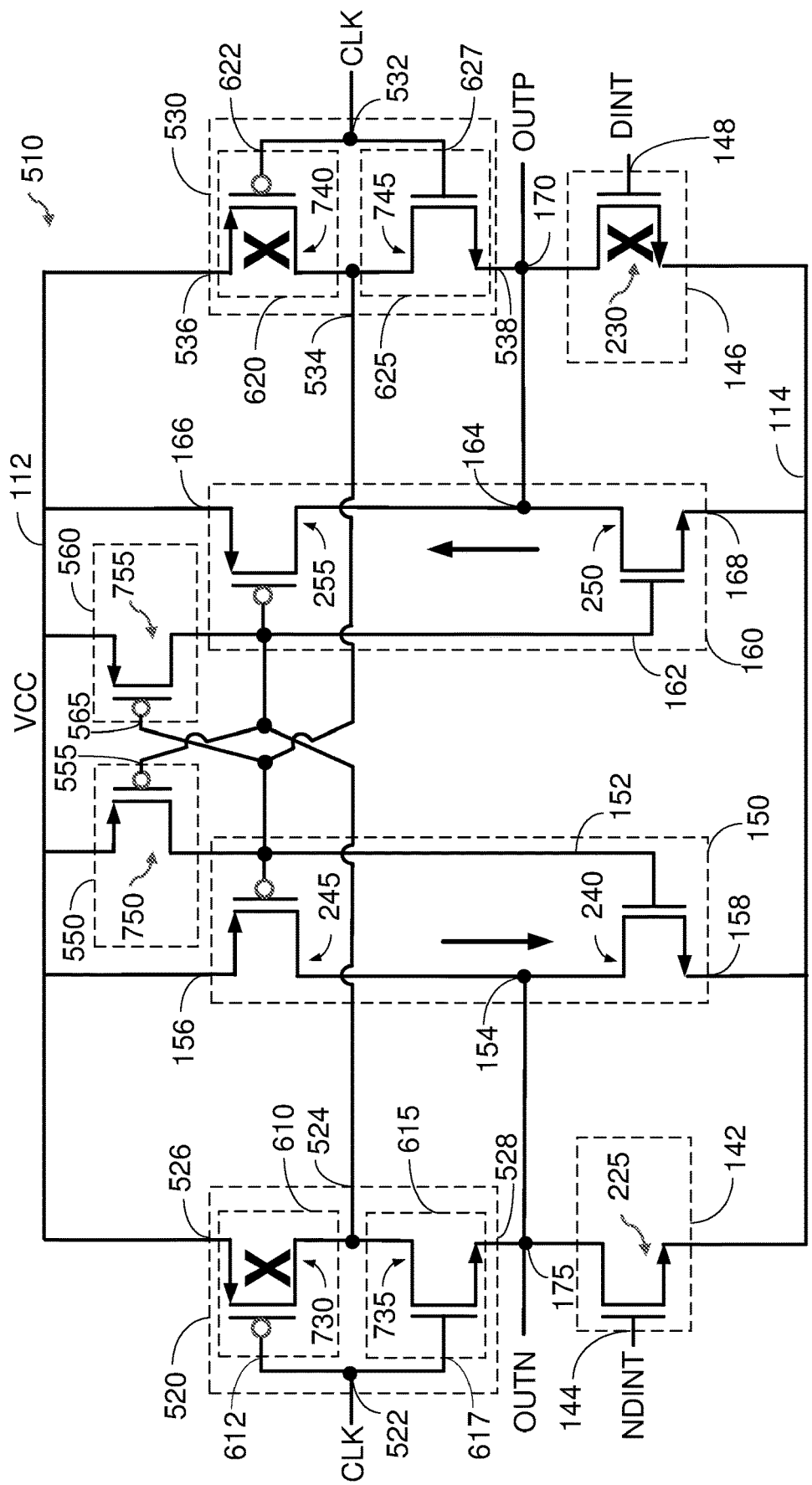
FIG. 8 C shows an example of the sense amplifier at a beginning of a decision phase according to certain aspects of the present disclosure.

FIG. 8C shows an example of the regeneration stage 510 at the beginning of the decision phase for the case where the voltage DINT falls below the threshold voltage before the voltage NDINT (i.e., INP>INN). In this example, the NFET 230 of the second regeneration-stage 146 turns off first, which triggers the regenerative feedback of the cross-coupled inverters 150 and 160 to pull the first output 170 high (indicated by the up arrow in FIG. 8C) and pull the second output 175 low (indicated by the down arrow in FIG. 8C). As discussed above, the pulling up of the first output 170 and the pulling down of the second output 175 produce a large differential output voltage representing a bit value.

In this example, the PFET 750 in the first regenerative switch 550 is turned on by the pulling down of the second output 175. As a result, the PFET 750 pulls the gate of the PFET 245 in the first inverter 150 to VCC, which helps fully turn off the PFET 245 in the first inverter 150. In this example, the NFET 745 in the fourth inverter 530 may prevent the output 534 of the fourth inverter 530 from rising all the way to VCC on its own to fully turn off the PFET 245 in the first inverter 150. This is because the NFET 745 may begin to turn off when the voltage at the source of the NFET 745 reaches a voltage equal to the voltage of the clock signal CLK minus the threshold voltage of the NFET 745. In this case, the PFET 750 in the first regenerative switch 550 is able to pull the gate of the PFET 245 up to VCC to fully turn off the PFET 245. This shuts off the current through the PFET 245, which helps the NFET 240 in the first inverter 150 to pull down the second output 175 to ground.

In this example, the PFET 755 in the second regenerative switch 560 is turned off since the first output 170 is pulled up in this example.

As discussed above, FIG. 8C shows the case where the voltage DINT falls below the threshold voltage before the voltage NDINT (i.e., INP>INN). For the case where the voltage NDINT falls below the threshold voltage before the voltage DINT (i.e., INN>INP), the NFET 225 of the first regeneration-stage switch 142 turns off first triggering the regenerative feedback of the cross-coupled inverters 150 and 160 to pull up the second output 175 and pull down the first output 170. In this example, the second regenerative switch 560 is turned on, which pulls up the gate of the PFET 255 in the second inverter 160 to VCC.

Figure 9:
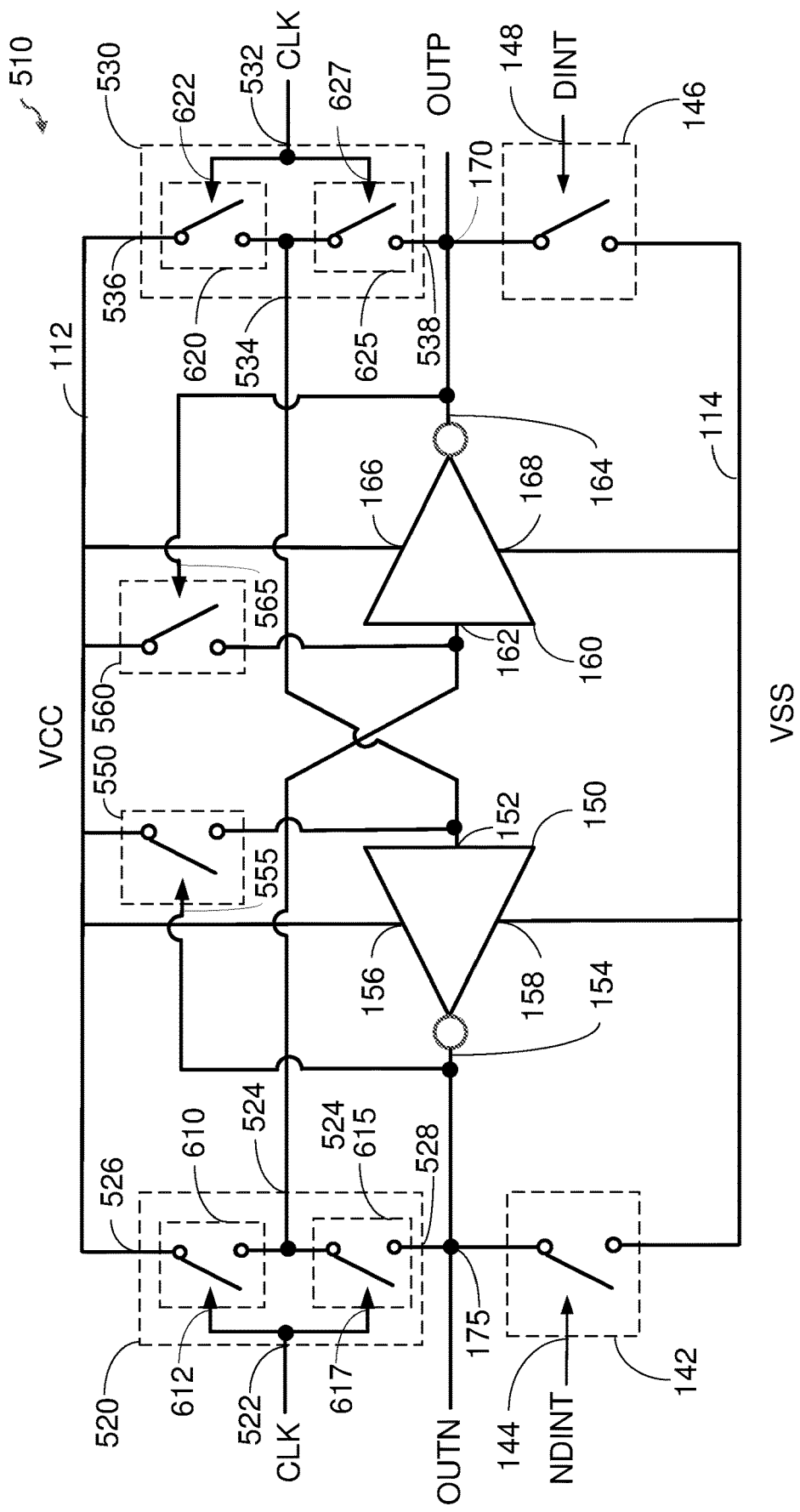
FIG. 9 shows an example of a sense amplifier including regenerative switches according to certain aspects of the present disclosure.

FIG. 9 shows an example in which the control input 555 of the first regenerative switch 550 is coupled to the output 154 of the first inverter 150. In this example, the first regenerative switch 550 turns on when the second output 175 is pulled low. This causes the first regenerative switch 550 to pull the input 152 of the first inverter 150 to VCC, which helps the first inverter 150 pull the second output 175 low.

In the example in FIG. 9, the control input 565 of the second regenerative switch 560 is coupled to the output 164 of the second inverter 160. In this example, the second regenerative switch 560 turns on when the first output 170 is pulled low. This causes the second regenerative switch 560 to pull the input 162 of the second inverter 160 to VCC, which helps the second inverter 160 pull the first output 170 low.

Figure 10:
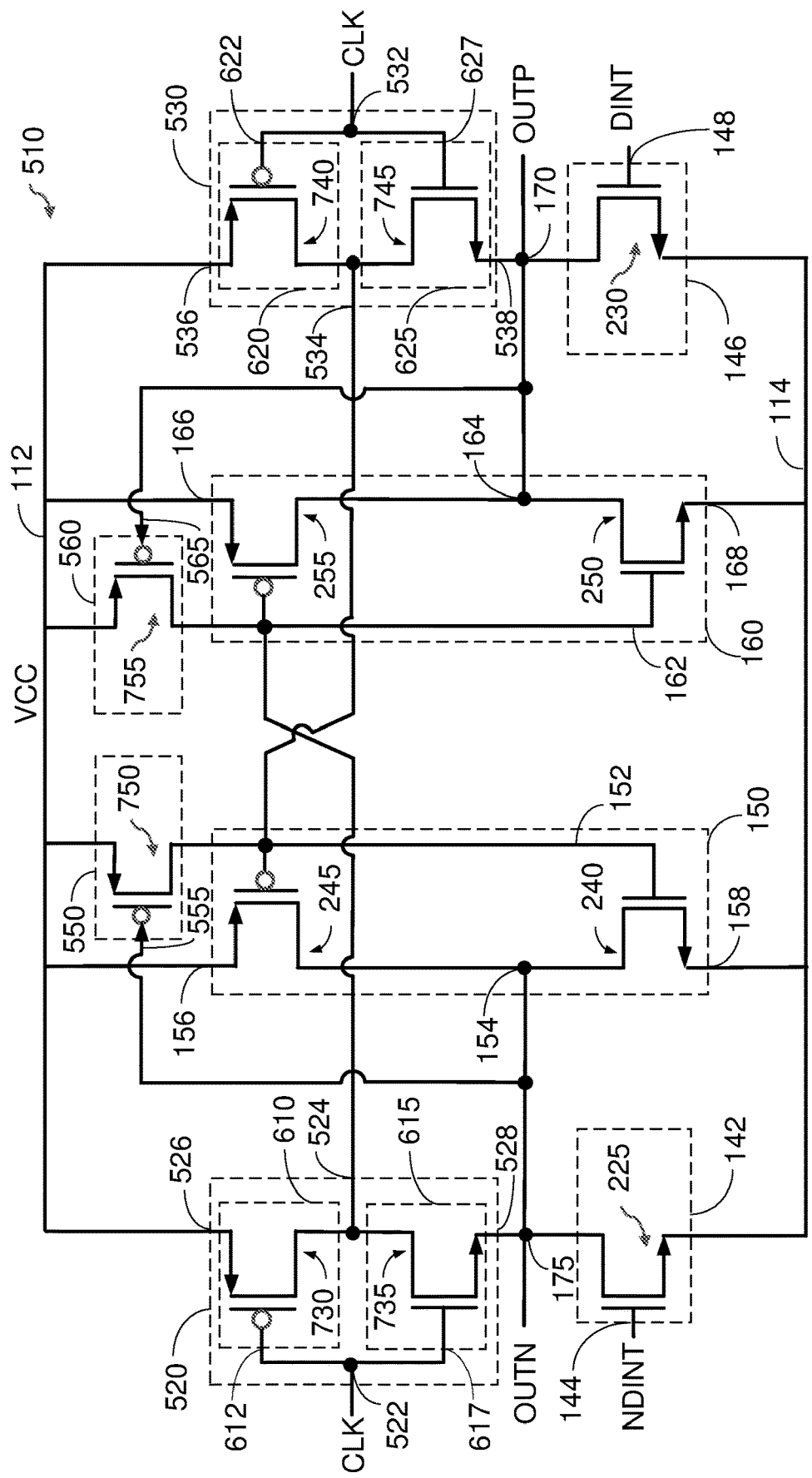
FIG. 10 shows another example of a sense amplifier including regenerative switches according to certain aspects of the present disclosure.

FIG. 10 shows an example in which the first regenerative switch 550 and the second regenerative switch 560 are implemented with the PFET 750 and the PFET 755, respectively. In this example, the gate of the PFET 750 is coupled to the output 154 of the first inverter 150, and the gate of the PFET 755 is coupled to the output 164 of the second inverter 160.

The PFET 750 increases regenerative gain for the case where the first inverter 150 pulls the second output 175 low. This is because pulling the second output 175 low turns on the PFET 750, which causes the PFET 750 to pull the input 152 of the first inverter 150 up to VCC. The pulling up of the input 152 to VCC fully turns off the PFET 245 in the first inverter 150, which shuts off the current path through the PFET 245 and helps the NFET 240 in the first inverter 150 pull the second output 175 low.

The PFET 755 increases regenerative gain for the case where the second inverter 160 pulls the first output 170 low. This is because pulling the first output 170 low turns on the PFET 755, which causes the PFET 755 to pull the input 162 of the second inverter 160 up to VCC. The pulling up of the input 162 to VCC fully turns off the PFET 255 in the second inverter 160, which shuts off the current path through the PFET 255 and helps the NFET 250 in the second inverter 160 pull the first output 170 low.

Figure 11:
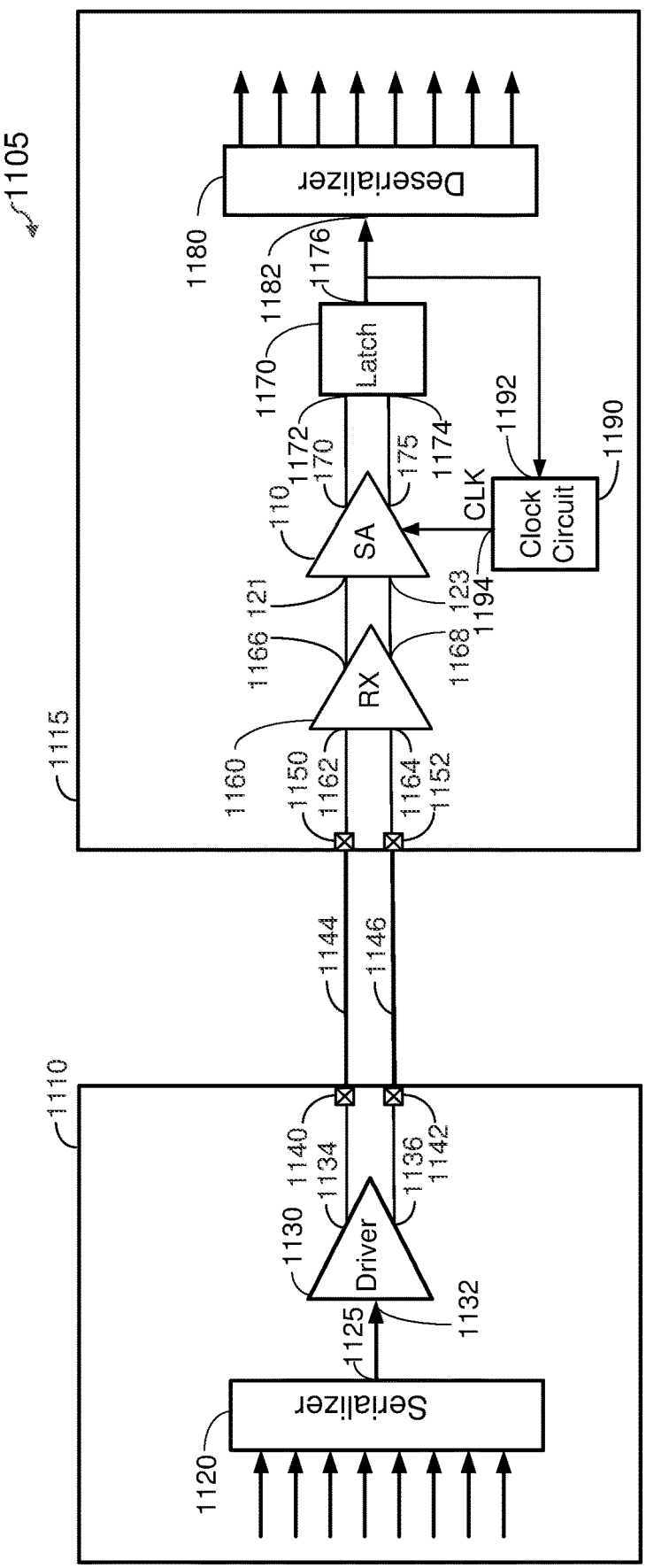
FIG. 11 shows an example of a system in which aspects of the present disclosure may be used according to certain aspects of the present disclosure.

FIG. 11 shows an example of a system 1105 in which aspects of the present disclosure may be used. In this example, the system 1105 includes a first chip 1110 and a second chip 1115 in which SerDes may be used for communication between the first chip 1110 and the second chip 1115. The first chip 1110 includes a serializer 1120, a driver 1130, a first output pin 1140, and a second output pin 1142. The second chip 1115 includes a first receive pin 1150, a second receive pin 1152, a receiver 1160, the sense amplifier 110, a latch 1170, and a deserializer 1180.

In this example, the first chip 1110 and the second chip 1115 are coupled via a differential serial link including a first line 1144 and a second line 1146. The first line 1144 is coupled between the first output pin 1140 and the first receive pin 1150, and the second line 1146 is coupled between the second output pin 1142 and the second receive pin 1055. Each line 1144 and 1146 may be implemented with a metal line on a substrate (e.g., a printed circuit board), a wire, etc.

On the first chip 1120, the serializer 1120 is configured to receive parallel data streams (e.g., from a processor on the first chip 1110) and convert the parallel data streams into a serial data stream, which is output at an output 1125 of the serializer 1120. The driver 1130 has an input 1132 coupled to the output 1125 of the serializer 1120, a first output 1134 coupled to the first output pin 1140, and a second output 1136 coupled to the second output pin 1142. The driver 1130 is configured to receive the serial data stream, convert the serial data stream into a differential signal, and drive the lines 1144 and 1146 of the differential seral link with the differential data signal to transmit the differential signal to the second chip 1105. It is to be appreciated that the first chip 1110 may include additional components not shown in FIG. 11 (e.g., impedance matching network coupled to the output pins 1140 and 1142, a pre-driver coupled between the serializer 1120 and the driver 1130, etc.).

On the second chip 1115, the receiver 1160 has a first input 1162 coupled to the first receive pin 1150, a second input 1164 coupled to the second receive pin 1152, a first output 1166 coupled to the first input 121 of the sense amplifier 110, and a second output 1168 coupled to the second input 123 of the sense amplifier 110. The receiver 1160 may include at least one of an amplifier and an equalizer (e.g., to compensate for frequency-dependent signal attenuation between the first chip 1110 and the second chip 1115). The sense amplifier 110 receives the differential signal from the receiver 1160 and makes bit decisions on the differential signal, as discussed above.

In the example in FIG. 11, the first output 170 of the sense amplifier 110 is coupled to a first input 1172 of the latch 1170, and the first output 175 of the sense amplifier 110 is coupled to a second input 1174 of the latch 1170. The latch 1170 has an output 1176 coupled to an input 1182 of the deserializer 1180. The latch 1170 is configured to latch bit decisions from the sense amplifier 110 and output the corresponding bits to the deserializer 1180. The deserializer 1180 is configured to convert the bits into parallel data streams, which may be output to one or more components (not shown) on the second chip 1115 for further processing. It is to be appreciated that the second chip 1115 may include additional components not shown in FIG. 11 (e.g., impedance matching network coupled to the receive pins 1150 and 1152, a clock recovery circuit, etc.).

In the example in FIG. 11, the second chip 1115 also includes a clock circuit 1190 configured to generate the clock signal CLK and output the clock signal CLK at output 1194. The output 1194 may be coupled to the input 522 of the third inverter 520 and the input 532 of the fourth inverter 530 in the regeneration stage 510. The output 1194 may also be coupled to the control inputs 118, 132 and 136 of the switches 116, 130 and 134, respectively, in the input stage 115.

The clock circuit 1190 may generate the clock signal CLK using clock data recovery in which the clock circuit 1190 receives bit decisions via input 1192 and controls the timing of clock transitions of the clock signal CLK via a phase interpolation based at least in part on the bit decisions. The input 1192 may be coupled to the output of the latch 1170, or one or both outputs 170 and 175 of the sense amplifier 110 to receive the bit decisions.

In certain aspects, the clock circuit 1190 may include a phase locked loop (PLL), a delay locked loop (DLL), an oscillator, a frequency divider, or any combination thereof. It is to be appreciated that the clock circuit 1190 may be implemented various types of clock generators.

Figure 12:
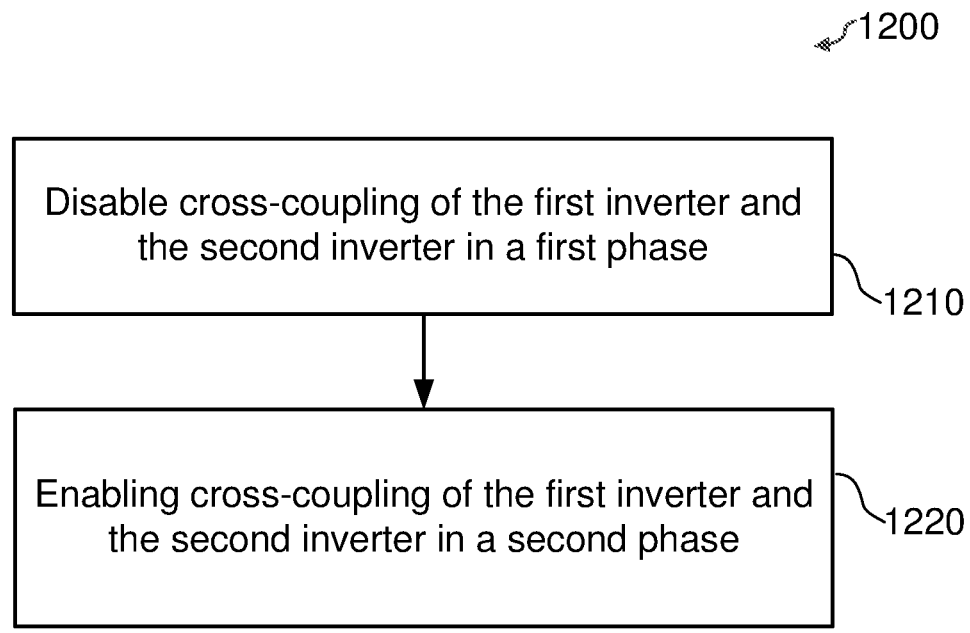
FIG. 12 is a flowchart illustrating an exemplary method for operation of a regeneration stage of a sense amplifier according to certain aspects of the present disclosure.

FIG. 12 illustrates an exemplary method 1200 for operation of a regeneration stage of a sense amplifier according to certain aspects of the present disclosure. The regeneration stage may correspond to the regeneration stage 510 according to any one or more of the various aspects illustrated in FIGS. 5 to 10. The regeneration stage includes a first inverter (e.g., first inverter 150) and a second inverter (e.g., second inverter 160).

At block 1210, cross-coupling of the first inverter and the second inverter is disabled in a first phase. The first phase may correspond to the reset phase discussed above. The disabling of the cross-coupling of the first inverter and the second inverter may be performed by the third inverter 520 and the fourth inverter 530. In certain aspects, the disabling of the cross-coupling of the first inverter and the second inverter may include decoupling an input (e.g., input 162) of the second inverter from an output (e.g., output 154) of the first inverter, and decoupling an input (e.g., input 152) of the first inverter from an output (e.g., 164) of the second inverter.

At block 1220, the cross-coupling of the second inverter and the second inverter is enabled in a second phase. The second phase may include the sensing phase and the decision phase discussed above. The enabling of the cross-coupling of the first inverter and the second inverter may be performed by the third inverter 520 and the fourth inverter 530. In certain aspects, enabling the cross-coupling of the first inverter and the second inverter may include coupling the input of the second inverter to the output of the first inverter, and coupling the input of the first inverter to the output of the second inverter.

In certain aspects, the method 1200 may also include, in the first phase, coupling the input of the first inverter and the input of the second inverter to a supply rail (e.g., supply rail 112), and, in the first phase, coupling the output of the first inverter and the output of the second inverter to a ground rail (e.g., ground rail).

In certain aspects, the regeneration stage may further includes a first switch (e.g., first regeneration-stage switch 142) coupled between the output of the first inverter and a ground rail (e.g., ground rail 114), and a second switch (e.g., second regeneration-stage switch 146) coupled between the output of the second inverter and the ground rail. In these aspects, the method 1200 may also include routing a first voltage (e.g., NDINT) from a first node (e.g., node 126) of an input stage (e.g., input stage 115) to a control input (e.g., control input 144) of the first switch, and routing a second voltage (e.g., DINT) from a second node (e.g., node 124) of the input stage to a control input (e.g., 148) of the second switch.

As used herein, a "control input" of a switch is an input that controls whether the switch is turned on (i.e., closed) or turned off (i.e., open) based on a signal (e.g., a voltage) at the control input. For an example where a switch is implemented with a transistor, the control input is located at the gate of the transistor. It is to be appreciated that a switch may be implemented with more than one transistor. For example, a switch may be implemented with a transmission gate, which may include an NFET and a PFET coupled in parallel and driven by complementary signals.

It is to be appreciated that the present disclosure is not limited to the exemplary terminology used above to describe aspects of the present disclosure. For example, the regeneration stage may also be referred to as a decision stage.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A regeneration stage of a sense amplifier, comprising:
a first inverter having an input and an output;
a second inverter having an input and an output;
a third inverter having an input, an output, a first supply terminal, and a second supply terminal, wherein the output of the third inverter is coupled to the input of the second inverter, the first supply terminal of the third inverter is coupled to a supply rail, and the second supply terminal of the third inverter is coupled to the output of the first inverter; and
a fourth inverter having an input, an output, a first supply terminal, and a second supply terminal, wherein the output of the fourth inverter is coupled to the input of the first inverter, the first supply terminal of the fourth inverter is coupled to the supply rail, and the second supply terminal of the fourth inverter is coupled to the output of the second inverter.

2. The regeneration stage of claim 1, wherein:
the first inverter has a first supply terminal coupled to the supply rail and a second supply terminal coupled to a ground rail; and
the second inverter has a first supply terminal coupled to the supply rail and a second supply terminal coupled to the ground rail.

3. The regeneration stage of claim 2, further comprising:
a first switch coupled between the output of the first inverter and the ground rail; and
a second switch coupled between the output of the second inverter and the ground rail.

4. The regeneration stage of claim 3, wherein:
the first switch has a control input coupled to a first node of an input stage; and
the second switch has a control input coupled to a second node of the input stage.

5. The regeneration stage of claim 1, further comprising:
a first switch coupled between the output of the first inverter and a ground rail; and
a second switch coupled between the output of the second inverter and the ground rail.

6. The regeneration stage of claim 5, wherein:
the first switch has a control input coupled to a first node of an input stage; and
the second switch has a control input coupled to a second node of the input stage.

7. The regeneration stage of claim 6, wherein the first switch comprises a first n-type field effect transistor (NFET) and the second switch comprises a second NFET.

8. The regeneration stage of claim 1, wherein the third inverter comprises:
a first switch coupled between the first supply terminal of the third inverter and the output of the third inverter, the first switch having a control input coupled to the input of the third inverter; and
a second switch coupled between the output of the third inverter and the second supply terminal of the third inverter, the second switch having a control input coupled to the input of the third inverter.

9. The regeneration stage of claim 8, wherein the fourth inverter comprises:
a third switch coupled between the first supply terminal of the fourth inverter and the output of the fourth inverter, the third switch having a control input coupled to the input of the fourth inverter; and
a fourth switch coupled between the output of the fourth inverter and the second supply terminal of the fourth inverter, the fourth switch having a control input coupled to the input of the fourth inverter.

10. The regeneration stage of claim 9, wherein:
the input of the third inverter is configured to receive a clock signal; and
the input of the fourth inverter is configured to receive the clock signal.

11. The regeneration stage of claim 1, wherein:
the input of the third inverter is configured to receive a clock signal; and
the input of the fourth inverter is configured to receive the clock signal.

12. The regeneration stage of claim 1, further comprising:
a first switch coupled between the supply rail and the input of the first inverter, the first switch having a control input coupled to the output of the third inverter; and
a second switch coupled between the supply rail and the input of the second inverter, the second switch having a control input coupled to the output of the fourth inverter.

13. The regeneration stage of claim 12, wherein the first switch comprises a first p-type field effect transistor (PFET) and the second switch comprises a second PFET.

14. The regeneration stage of claim 1, further comprising:
a first switch coupled between the supply rail and the input of the first inverter, the first switch having a control input coupled to the output of the first inverter; and
a second switch coupled between the supply rail and the input of the second inverter, the second switch having a control input coupled to the output of the second inverter.

15. The regeneration stage of claim 14, wherein the first switch comprises a first p-type field effect transistor (PFET) and the second switch comprises a second PFET.

16. A method for operation of a regeneration stage of a sense amplifier, the regeneration stage including a first inverter and a second inverter, the method including:
in a first phase, disabling cross-coupling of the first inverter and the second inverter, wherein disabling the cross-coupling of the first inverter and the second inverter comprises
decoupling an input of the second inverter from an output of the first inverter, and decoupling an input of the first inverter from an output of the second inverter; and in a second phase, enabling the cross-coupling of the first inverter and the second inverter, wherein enabling the cross-coupling of the first inverter and the second inverter comprises
coupling the input of the second inverter to the output of the first inverter, and
coupling the input of the first inverter to the output of the second inverter;

in the first phase, coupling the input of the first inverter and the input of the second inverter to a supply rail; and in the first phase, coupling the output of the first inverter and the output of the second inverter to a ground rail.

17. A method for operation of a regeneration stage of a sense amplifier, the regeneration stage including a first inverter, a second inverter, a first switch coupled between an output of the first inverter and a ground rail, and a second switch coupled between an output of the second inverter and the ground rail, the method comprising:

in a first phase, disabling cross-coupling of the first inverter and the second inverter, wherein disabling the cross-coupling of the first inverter and the second inverter comprises
decoupling an input of the second inverter from the output of the first inverter, and
decoupling an input of the first inverter from the output of the second inverter; and in a second phase, enabling the cross-coupling of the first inverter and the second inverter, wherein enabling the cross-coupling of the first inverter and the second inverter comprises
coupling the input of the second inverter to the output of the first inverter, and
coupling the input of the first inverter to the output of the second inverter;

routing a first voltage from a first node of an input stage to a control input of the first switch; and routing a second voltage from a second node of the input stage to a control input of the second switch.

18. A system comprising:
a receiver;
a latch; and
a sense amplifier coupled between the receiver and the latch, wherein the sense amplifier comprises:
an input stage; and
a regeneration stage coupled to the input stage, wherein the regeneration stage comprises:
a first inverter having an input and an output;
a second inverter having an input and an output;
a third inverter having an input, an output, a first supply terminal, and a second supply terminal, wherein the output of the third inverter is coupled to the input of the second inverter, the first supply terminal of the third inverter is coupled to a supply rail, and the second supply terminal of the third inverter is coupled to the output of the first inverter; and
a fourth inverter having an input, an output, a first supply terminal, and a second supply terminal, wherein the output of the fourth inverter is coupled to the input of the first inverter, the first supply terminal of the fourth inverter is coupled to the supply rail, and the second supply terminal of the fourth inverter is coupled to the output of the second inverter.

19. The system of claim 18, wherein the receiver comprises an equalizer.

20. The system of claim 18, further comprising a deserializer coupled to the latch.

\* \* \* \* \*